United States Patent
Yoshida et al.

(10) Patent No.: US 9,267,697 B2
(45) Date of Patent: Feb. 23, 2016

(54) AIR-CONDITIONING SYSTEM

(71) Applicant: FUJITSU LIMITED, Kawasaki-shi, Kanagawa (JP)

(72) Inventors: Hiroaki Yoshida, Isehara (JP); Hiroyuki Fukuda, Ebina (JP)

(73) Assignee: FUJITSU LIMITED, Kawasaki (JP)

( * ) Notice: Subject to any disclaimer, the term of this patent is extended or adjusted under 35 U.S.C. 154(b) by 354 days.

(21) Appl. No.: 13/767,149

(22) Filed: Feb. 14, 2013

(65) Prior Publication Data

US 2013/0154135 A1    Jun. 20, 2013

Related U.S. Application Data

(63) Continuation of application No. PCT/JP2010/065325, filed on Sep. 7, 2010.

(51) Int. Cl.
*B01F 3/04* (2006.01)
*F24F 6/06* (2006.01)
(Continued)

(52) U.S. Cl.
CPC ............. *F24F 6/06* (2013.01); *F24F 3/1423* (2013.01); *H05K 7/20827* (2013.01); *F24F 2003/1446* (2013.01); *F24F 2003/1464* (2013.01)

(58) Field of Classification Search
CPC ... F24F 3/1423; F24F 6/06; F24F 2003/1446; F24F 2003/1464; H05K 7/20827
USPC ............. 261/129, 130, 131, 133, 161, 30; 96/125, 127, 130
See application file for complete search history.

(56) References Cited

U.S. PATENT DOCUMENTS

| | | | | |
|---|---|---|---|---|
| 3,488,971 A | * | 1/1970 | Meckler | 62/3.2 |
| 3,844,737 A | * | 10/1974 | Macriss et al. | 95/93 |
| 3,880,224 A | * | 4/1975 | Weil | 165/7 |

(Continued)

FOREIGN PATENT DOCUMENTS

| JP | H4-161754 | 6/1992 |
|---|---|---|
| JP | H7-243668 | 9/1995 |

(Continued)

OTHER PUBLICATIONS

Notice of Reason for Refusal mailed Oct. 1, 2013 from the Japanese Patent Office in counterpart application No. 2012-532762 with English translation.

(Continued)

*Primary Examiner* — Charles Bushey
(74) *Attorney, Agent, or Firm* — Kratz, Quintos & Hanson, LLP

(57) ABSTRACT

An air-conditioning system includes: a first duct through which air discharged from an electronic instrument passes; a water vapor retention chamber; an evaporator configured to be heated by the air passing through the first duct and thereby to generate water vapor inside the water vapor retention chamber; a desiccant rotor including an adsorbent to adsorb moisture and configured to be driven and rotated by a driving unit; a humidification chamber; a second duct configured to feed outdoor air introduced from an outdoor space into the humidification chamber; and a third duct configured to feed the air passing through the humidification chamber into a room where the electronic instrument is installed, wherein a portion of the desiccant rotor is located inside the water vapor retention chamber, and another portion of the desiccant rotor is located inside the humidification chamber.

9 Claims, 5 Drawing Sheets

(51) Int. Cl.
*F24F 3/14* (2006.01)
*H05K 7/20* (2006.01)

(56) References Cited

U.S. PATENT DOCUMENTS

| | | | | |
|---|---|---|---|---|
| 4,841,733 | A * | 6/1989 | Dussault et al. | 62/93 |
| 5,325,676 | A * | 7/1994 | Meckler | 62/93 |
| 6,406,522 | B1 * | 6/2002 | McFadden et al. | 95/113 |
| 6,675,601 | B2 * | 1/2004 | Ebara | 62/271 |
| 7,903,407 | B2 | 3/2011 | Matsushima | |
| 2005/0039481 | A1 * | 2/2005 | Chant | 62/271 |
| 2005/0268635 | A1 * | 12/2005 | Moffitt | 62/271 |

FOREIGN PATENT DOCUMENTS

| | | |
|---|---|---|
| JP | H11-264589 | 9/1999 |
| JP | 2003-21378 A1 | 1/2003 |
| JP | 2006-189189 A1 | 7/2006 |
| JP | 2010-025516 | 2/2010 |
| JP | 2010-32174 A1 | 2/2010 |
| JP | 2001-311537 A1 | 11/2011 |

OTHER PUBLICATIONS

Office Action of China Patent Application 201080068611.X. dated Mar. 23, 2015. Full Translation of the Office Action.

International Search Report for International Application No. PCT/JP2010/065325 dated Oct. 19, 2010.

Chinese Notification of the First Office Action dated Sep. 29, 2014, in the corresponding Chinese patent application No. 201080068611.X, with English translation.

* cited by examiner

AIR-CONDITIONING SYSTEM

CROSS-REFERENCE TO RELATED APPLICATION

This application is a continuation of International Patent Application No. PCT/JP2010/065325 filed Sep. 7, 2010 and designated the U.S., the entire contents of which are incorporated herein by reference.

FIELD

The embodiments discussed herein relate to an air-conditioning system configured to condition indoor air by introducing outdoor air.

BACKGROUND

In recent years, a large amount of data are being handled by computers (computer devices) with the advent of an advanced information society, and numerous computers are often installed in one room for the purpose of collective management in a facility such as a data center. Under this circumstance, the computers generate a large amount of heat which may lead to erroneous operations or failures. Accordingly, a measure for cooling the computers is used. For this reason, a data center is usually designed to let the heat generated in the computers out of the computers using fans (air blowers), and to adjust the temperature in the room using an air-conditioning machine (an air conditioner).

In the meantime, the amount of heat generated by the computers fluctuates depending on operating conditions of the computers. A conceivable option for reliably preventing erroneous operations or failures of the computers attributed to the heat is to use an air-conditioning machine, which has a cooling capacity corresponding to a sum of maximum amounts of heat generated by all the computers in a computer room. However, an air-conditioning machine with such a large cooling capacity generally has large power consumption, which is undesirable in terms of energy conservation. In this regard, efficient operation of an air-conditioning facility inclusive of an air-conditioning machine is preferred.

Patent Document 1: Japanese Laid-open Patent Publication No. 2010-32174

A conventional data center is designed to manage the air temperature while circulating the air within a computer room. As a consequence, no matter how efficiently the air-conditioning facility is operated, the air-conditioning facility consumes at least the electric power corresponding to the amount of heat generated by all the computers in the computer room, and may be unable to achieve further reduction of the above-mentioned power consumption.

SUMMARY

According to an aspect, an air-conditioning system includes: a first duct through which air discharged from an electronic instrument passes; a water vapor retention chamber; an evaporator configured to be heated by the air passing through the first duct and thereby to generate water vapor inside the water vapor retention chamber; a desiccant rotor including an adsorbent to adsorb moisture and configured to be driven and rotated by a driving unit; a humidification chamber; a second duct configured to feed outdoor air introduced from an outdoor space into the humidification chamber; and a third duct configured to feed the air passing through the humidification chamber into a room where the electronic instrument is installed, wherein a portion of the desiccant rotor is located inside the water vapor retention chamber, and another portion of the desiccant rotor is located inside the humidification chamber.

The object and advantages of the invention will be realized and attained by means of the elements and combinations particularly pointed out in the claims.

It is to be understood that both the foregoing general description and the following detailed description are exemplary and explanatory and are not restrictive of the invention.

DESCRIPTION OF EMBODIMENTS

A prelude for facilitating the understanding of an embodiment will be described below prior to explaining the embodiment.

In order to reduce power used for air conditioning in a facility such as a data center, outdoor air may be introduced into a room when the temperature of the outdoor air is low. In the case of a data center designed to supply the air adjusted to the temperature of 20° C. into a room by using an air-conditioning machine, for example, reduction in the power used for an air-conditioning facility may be expected by introducing the outdoor air into the room when the temperature of the outdoor air is equal to or below 20° C.

However, the humidity in the room is also managed in the data center in order to prevent occurrence of troubles in the computers caused by static electricity. Even when the amount of moisture contained in the air is the same, the humidity (which hereinafter means the relative humidity) of the air becomes lower as its temperature becomes higher. For this reason, if the outdoor air in the winter, such as the outdoor air having the temperature equal to or below 10° C. and the humidity equal to or below 50%, is directly introduced into a computer room, the humidity falls to a low level along with the rise in temperature.

Generally, the humidity in the computer room is adjusted within a range from about 50% to 60% in the data center by installing a heating-type humidifier, an ultrasonic-type humidifier or the like in the room. However, simple introduction of the outdoor air into the computer room may lead to a shortage of humidification capacity with only a conventionally used humidifier. Accordingly, a countermeasure such as increasing in the number of humidifiers or introducing a humidifier with a larger humidification capacity becomes preferable. Nevertheless, power consumption will be increased by taking such a countermeasure. As a consequence, the effect of reduction in the power consumption by the air-conditioning facility is not fully obtained even when the outdoor air is introduced.

In view of the above, there is a demand for an air-conditioning system which takes less power for managing the humidity when the outdoor air is introduced.

EMBODIMENT

Figure 1:
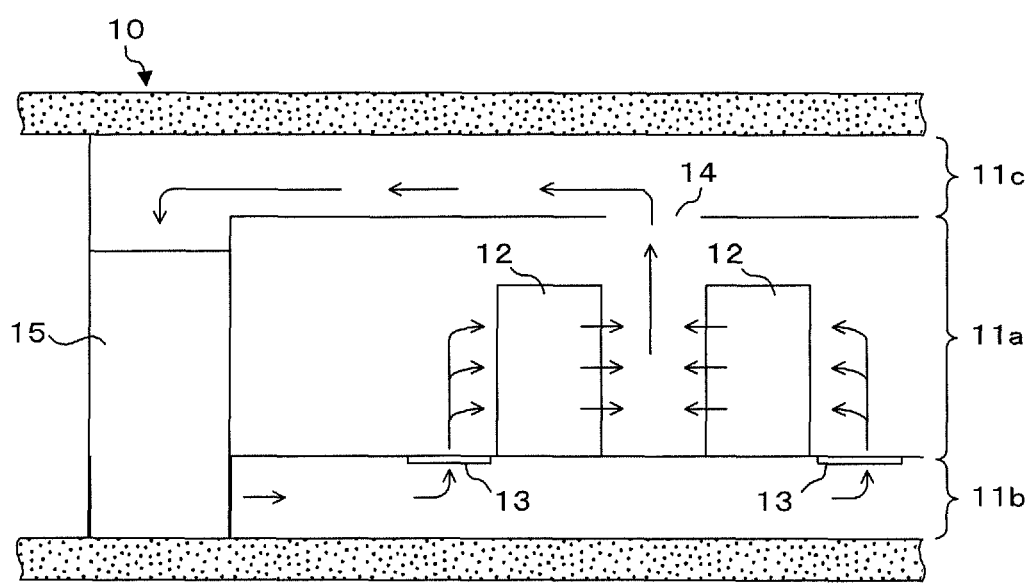
FIG. 1 is a schematic diagram depicting an example of a computer room.

FIG. 1 is a schematic diagram depicting an example of a computer room. The following embodiment describes air conditioning of a computer room as an example.

A computer room 10 includes an instrument installation area 11a where racks 12 are installed, a free access floor 11b provided under the floor of the instrument installation area 11a and having power cables and signal cables installed, and an exhaust flow channel 11c provided in the attic of the instrument installation area 11a. A plurality of computers (not depicted) are placed in each of the racks 12. Moreover, an air-conditioning machine 15 is installed in the computer room 10. The air-conditioning machine 15 is configured to cool the air taken in through the exhaust flow channel 11c, and to supply the cooled air to the free access floor 11b.

The racks 12 are arranged in rows. The racks 12 in one row and the racks 12 in another row adjacent to the one row are laid out in such a manner that intake surfaces of the racks 12 in the one row face intake surfaces of the racks 12 in the other row or in such a manner that exhaust surfaces of the racks 12 in the one row face exhaust surfaces of the racks 12 of the other row. In addition, an opening 14 for connecting the instrument installation area 11a to the exhaust flow channel 11c is provided at each portion on the ceiling near the exhaust surfaces of the racks 12, while a grille (a vent) 13 for connecting the instrument installation area 11a to the free access floor 11b is provided at each portion on the floor near the intake surfaces of the racks 12.

The low-temperature air supplied from the air-conditioning machine 15 to the free access floor 11b is sent to the instrument installation area 11a via the grilles 13 and is taken into the racks 12 from the intake surfaces. Then, the air heated to a high temperature as a result of cooling the computers is discharged from the exhaust surfaces of the racks 12. This air enters the exhaust flow channel 11c via the openings 14 and returns to the air-conditioning machine 15 through the exhaust flow channel 11c.

Figure 2:
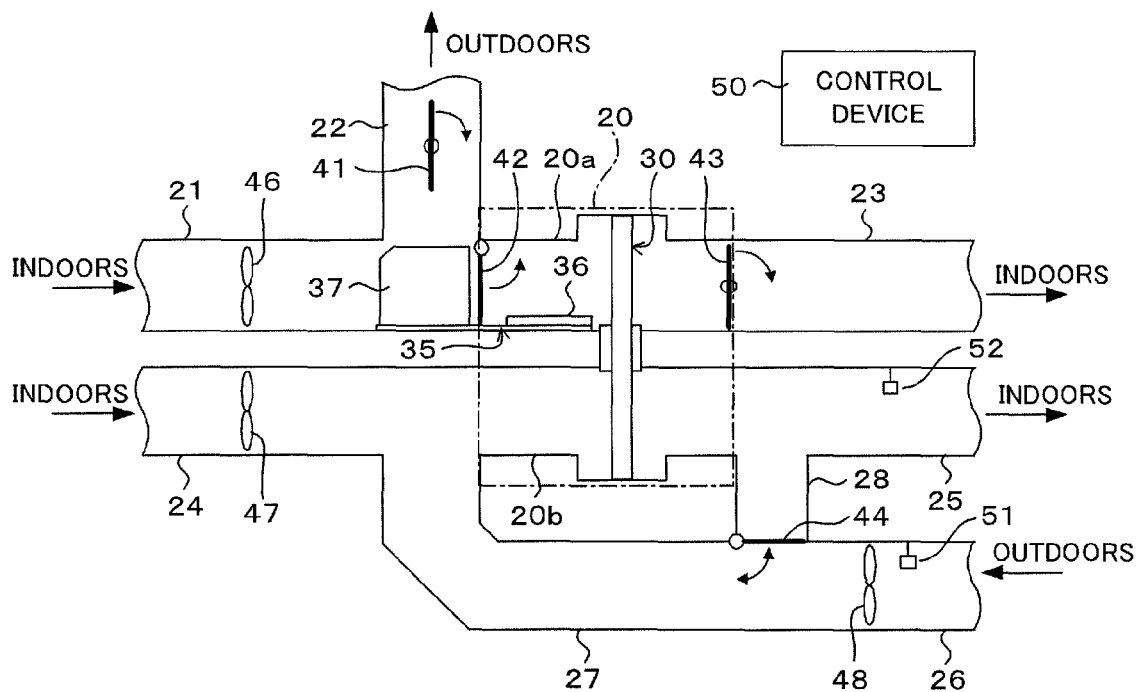
FIG. 2 is a schematic diagram of an air-conditioning system according to an embodiment.

FIG. 2 is a schematic diagram of an air-conditioning system according to the embodiment.

As depicted in FIG. 2, the air-conditioning system according to the embodiment includes a humidity adjustment unit 20, ducts 21 to 28, air valves 41 to 44, fans (air blowers) 46 to 48, and sensor units 51 and 52 which detect the temperature and humidity. Meanwhile, the humidity adjustment unit 20 includes a water vapor retention chamber 20a, a humidification chamber 20b, a desiccant rotor device 30, and an evaporator 35. The air-conditioning system according to the embodiment further includes a control device 50, which is configured to receive signals from the sensor units 51 and 52 and to control drive of the desiccant rotor device 30, the air valves 41 to 44, and the fans 46 to 48.

Figure 3:
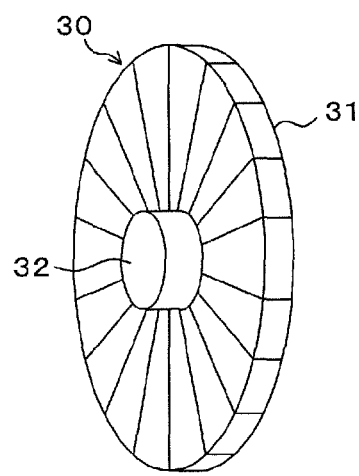
FIG. 3 is a schematic diagram of a desiccant rotor device.

As schematically depicted in FIG. 3, the desiccant rotor device 30 includes a disk-shaped desiccant rotor 31, and a driving unit 32 located along the central axis of the desiccant rotor 31 and configured to rotate the desiccant rotor 31. The desiccant rotor 31 is formed of a member such as a non-woven fabric, which allows passage of the air in the thickness direction thereof, and contains an adsorbent having a property to adsorb moisture in the air. Silica gel, zeolite, activated carbon, and the like may be used as the adsorbent. In this embodiment, activated carbon is used as the adsorbent because activated carbon may be recovered (dried) at a relatively low temperature.

Figure 4:
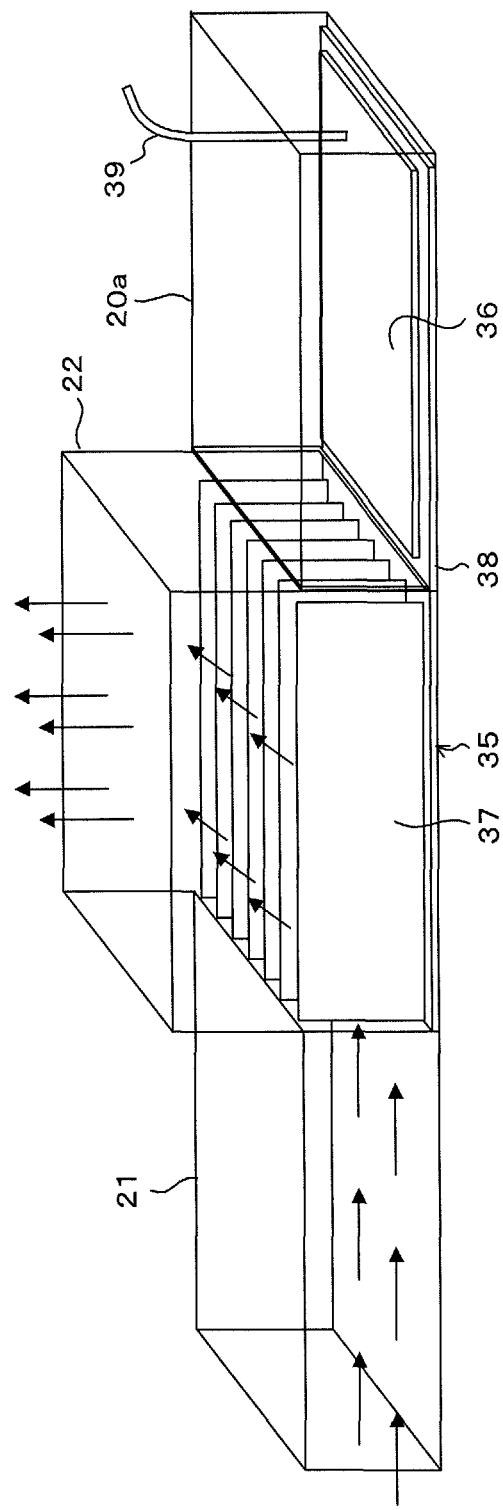
FIG. 4 is a schematic diagram (a perspective view) depicting an evaporator and its adjacent portions.

FIG. 4 is a schematic diagram (a perspective view) depicting the evaporator 35 and its adjacent portions. As depicted in FIG. 4, the evaporator 35 includes a heat transfer plate 38, a plurality of fins (heat-absorbing plates) 37 arranged on one side of the heat transfer plate 38, and a water storage unit 36 arranged on the other side of the heat transfer plate 38. The heat transfer plate 38 and the fins 37 are made of a material having fine heat conductivity such as copper (Cu), aluminum (Al) or carbon. Here, the heat transfer plate 38 and the fins 37 are made of copper, and the fins 37 and the heat transfer plate 38 are brazed to one another.

The water storage unit 36 is formed by containing a member having a fine water-absorbing property such as a non-woven fabric. When the air-conditioning system is in operation, water is supplied to the water storage unit 36 as appropriate through a water supply pipe 39 so that the water storage unit 36 is always kept in a wet condition. A portion of the evaporator 35 where the fins 37 are arranged will be hereinafter referred to as a heat exchange unit and a portion of the evaporator 35 where the water storage unit 36 is arranged will be hereinafter referred to as an evaporation unit.

Next, relations of connection among the humidity adjustment unit 20 and the ducts 21 to 28 will be described with reference to FIG. 2. The duct 21 (an example of a first duct), the water vapor retention chamber 20a of the humidity adjustment unit 20, and the duct 23 are linearly arranged and connected in this order. Meanwhile, the duct 22 is connected to an end of the duct 21 near the water vapor retention chamber 20a in a perpendicular manner to the duct 21. In this embodiment, both of the duct 21 and the duct 23 are connected to the exhaust flow channel 11c of the computer room 10 while the duct 22 is connected outdoors.

The fan 46 is located inside the duct 21. The air at a relatively high temperature (from 30° C. to 35° C., for example) passing through the exhaust flow channel 11c of the computer room 10 is introduced into the duct 21 by rotation of this fan 46. Meanwhile, the heat exchange unit (the fins 37) of the evaporator 35 is located at an end portion inside the duct 21 near the water vapor retention chamber 20a. The air introduced into the duct 21 moves to the duct 22 through spaces formed between the fins 37 of the evaporator 35 and is then discharged outdoors. The air valve 41 is located inside the duct 22.

The air valve 42 is located at a junction of the water vapor retention chamber 20a and the duct 21 while the air valve 43 is located at a junction of the water vapor retention chamber 20a and the duct 23. The inside of the water vapor retention chamber 20a becomes a substantially enclosed space when both of the air valves 42 and 43 are closed.

The evaporation unit (the water storage unit 36) of the evaporator 35 is located inside the water vapor retention chamber 20a. The evaporation unit is thermally connected to the heat exchange unit (the fins 37) inside the duct 21 via the heat transfer plate 38 which passes through a gap provided below the air valve 42. In addition, a portion of the desiccant rotor device 30 above the driving unit 32 is located inside the water vapor retention chamber 20a as depicted in FIG. 2.

The duct 24 (an example of a fourth duct), the humidification chamber 20b of the humidity adjustment unit 20, and the duct 25 (an example of a third duct) are linearly arranged and connected in this order, and are located below the duct 21, the water vapor retention chamber 20a, and the duct 23. In this embodiment, both of the duct 24 and the duct 25 are connected to the exhaust flow channel 11c in the computer room 10.

The fan 47 (an example of a second flow rate adjustment unit) is located inside the duct 24. The air in the computer room 10 is introduced into the duct 24 by rotation of this fan 47. A portion of the desiccant rotor device 30 below the driving unit 32 is located inside the humidification chamber 20b. The air passing through the desiccant rotor device 30 is released into the computer room 10 via the duct 25.

The fan 48 (an example of a first flow rate adjustment unit) is located inside the duct 26 (an example of a second duct). The outdoor air is introduced into the duct 26 by rotation of this fan 48. This duct 26 is connected to the duct 25 via the duct 28, and is also connected to the duct 24 via the duct 27. The air valve (a switch valve) 44 is located at a branching portion between the duct 27 and the duct 28. The air introduced into the duct 26 is sent either to the duct 27 or to the duct 28 by means of this air valve 44.

The sensor unit 51 is located inside the duct 26 and is configured to detect the temperature and humidity of the outdoor air. Meanwhile, the sensor unit 52 is located inside the duct 25 and is configured to detect the temperature and humidity of the air passing through the duct 25.

Next, an operation of the desiccant rotor device 30 of this embodiment will be described.

As mentioned previously, the air valves 42 and 43 are provided at the two end portions of the water vapor retention chamber 20a, and the inside of the water vapor retention chamber 20a becomes the substantially enclosed space when both of the air valves 42 and 43 are closed. When the fins 37 of the evaporator 35 are heated by the relatively high-temperature air passing through the ducts 21 and 22, the heat of the fins 37 is also transferred to the water storage unit 36 located inside the water vapor retention chamber 20a, whereby the moisture evaporates from the water storage unit 36. Accordingly, both of the temperature and the moisture (a relative vapor pressure) inside the water vapor retention chamber 20a are increased. As a consequence, a large amount of moisture is adsorbed to the desiccant rotor 31.

This desiccant rotor 31 is driven and rotated by the driving unit 32. When the portion of the desiccant rotor 31 having absorbed the moisture goes into the humidification chamber 20b, the moisture evaporates from the desiccant rotor 31 because the air entering the humidification chamber 20b has the relatively low humidity. Thus, the desiccant rotor 31 is recovered (dried) and the amount of moisture contained in the air passing through the desiccant rotor 31 is increased as a consequence.

Assuming that a rotational speed of the desiccant rotor 31 remains within a predetermined range, the faster the rotational speed of the desiccant rotor 31 is, the larger the amount of moisture contained in the air passing through the desiccant rotor 31 is. Thus, the amount of humidification may be adjusted by the rotational speed of the desiccant rotor 31. Although FIG. 2 depicts the case where the desiccant rotor device 30 has the single desiccant rotor 31, a plurality of the desiccant rotors 31 may be placed in the humidity adjustment unit 20 if the single desiccant rotor 31 does not achieve a sufficient amount of humidification.

Figure 5:
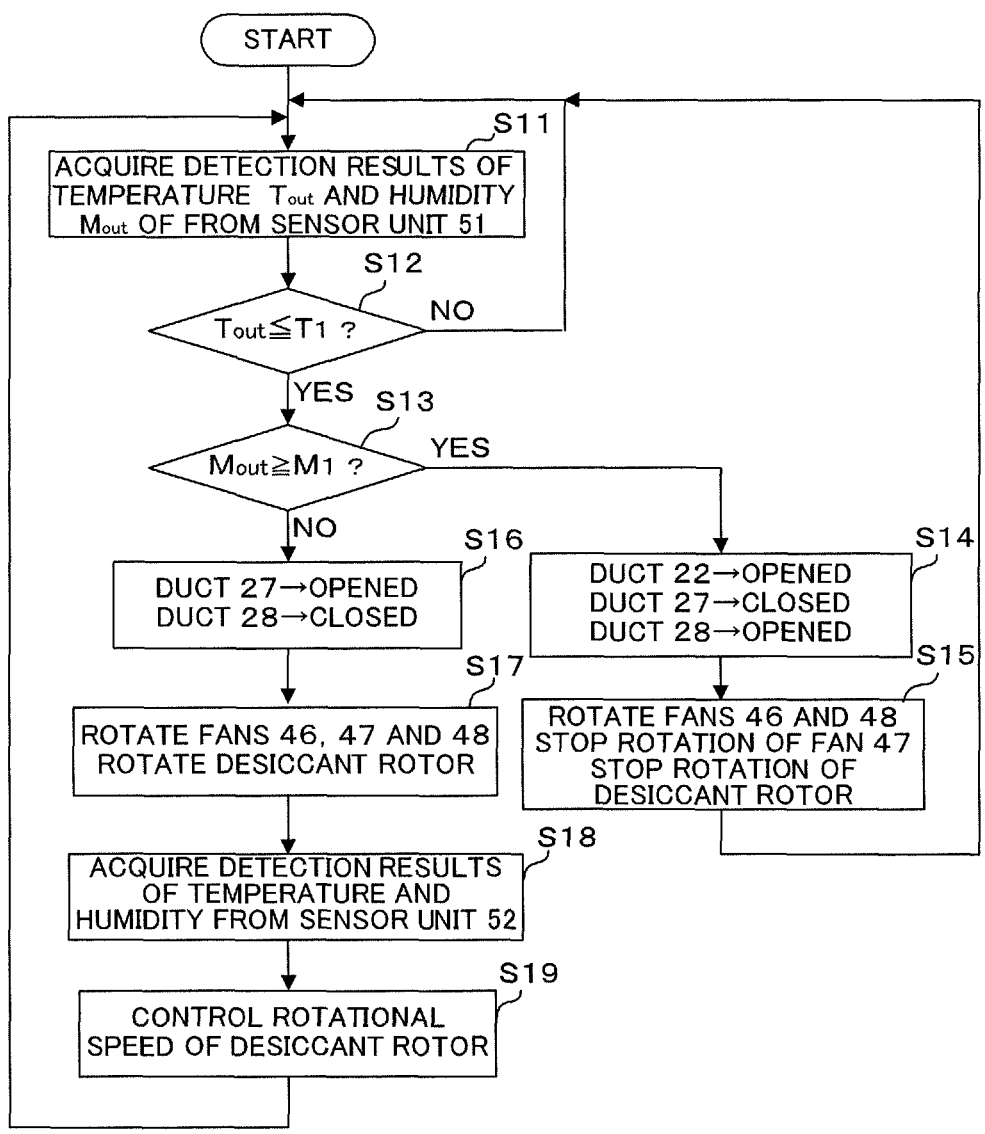
FIG. 5 is a flowchart for explaining an operation of the air-conditioning system according to the embodiment.

An operation of the air-conditioning system according to this embodiment will be described below with reference to a flowchart in FIG. 5. Here, both of the air valves 42 and 43 are closed while the air valve 41 is open in an initial state.

First, in step S11, the control device 50 acquires detection results of a temperature $T_{out}$ of the outdoor air and a humidity $M_{out}$ of the outdoor air from the sensor unit 51. Then, in step S12, the control device 50 determines whether or not the temperature $T_{out}$ of the outdoor air is equal to or below a preset temperature $T_1$ which is set in advance. When the temperature $T_{out}$ of the outdoor air is determined to be higher than the preset temperature $T_1$ (such as 25° C.) (in the case of NO), the outdoor air is not taken into the computer room 10. In this case, the operation goes back from step S12 to step S11.

On the other hand, when the temperature $T_{out}$ of the outdoor air is determined to be equal or below the preset temperature $T_1$ (in the case of YES) in step S12, the operation goes to step S13. Then, in step S13, the control device 50 determines whether or not the humidity $M_{out}$ of the outdoor air is equal to or above a preset humidity $M_1$ such as a weight absolute humidity of 0.099 (kg/kg (DA)).

When the humidity $M_{out}$ of the outdoor air is determined to be higher than the preset value $M_1$ (in the case of YES), this means that humidification is not preferable. In this case, the operation goes to step S14 in which the control device 50 drives the air valve 44 so as to close the duct 27 side and to open the duct 28 side. Further, in order to discharge the exhaust air in the same amount as the taken-in outdoor air from the computer room 10 to the outdoors, the control device 50 drives the air valve 41 so as to open (continue to open) the duct 22. Thereafter, the operation goes to step S15 to rotate (start rotation or continue rotation of) the fans 46 and 48. Accordingly, the outdoor air passes through the duct 26, the duct 28, and the duct 25 in this order and is introduced into the computer room 10. In the meantime, the exhaust air is discharged from the computer room 10 through the ducts 21 and 22. In other words, the outdoor air is introduced into the computer room 10 without passing through the desiccant rotor 31 in this case. After the processing in step S14 and S15 is executed, the operation returns to step S11.

If the fan 47 and the desiccant rotor 31 are rotated in step S17 to be described later, then the rotation of the fan 47 and the desiccant rotor 31 is stopped in step S15.

On the other hand, when the humidity $M_{out}$ of the outdoor air is determined to be equal to or below the preset value $M_1$ (in the case of NO) in step S13, this means that humidification is preferable when introducing the outdoor air. In this case, the operation goes to step S16 in which the control device 50 drives the air valve 44 so as to close the duct 28 side and to open the duct 27 side. Thereafter, the operation goes to step S17 in which the control device 50 rotates (starts rotation or continues rotation of) the fans 46, 47, and 48, as well as rotates (starts rotation or continues rotation of) the desiccant rotor 31.

Accordingly, the relatively high-temperature air (such as from 30° C. to 35° C.) discharged from the racks 12 is introduced into the duct 21 and the desiccant rotor 31 starts rotation at a preset rotational speed. Meanwhile, water is supplied to the evaporator (the water storage unit 36) via the water supply pipe 39. Hence, the inside of the water vapor retention chamber 20 turns into the state of a high temperature and a high humidity, and a large amount of moisture is adsorbed to the desiccant rotor 31. The moisture is carried to the humidification chamber 20b with rotation of the desiccant rotor 31.

In the meantime, the air in the computer room 10 is introduced into the duct 24 by rotation of the fan 47 while the outdoor air is introduced into the duct 26 by rotation of the fan 48. These air components are mixed at the junction of the duct 24 and the duct 27 and go into the humidification chamber 20b of the humidity adjustment unit 20. The humidity of this mixed air is increased by receiving sufficient moisture when passing through the desiccant rotor 31 located in the humidification chamber 20b, and the mixed air is then introduced into the computer room 10 via the duct 25. After the processing in step S16 and S17 is executed, the operation goes to step S18.

In step S18, the control device 50 acquires detection results of the temperature and humidity of the air, which passes through the duct 25, from the sensor unit 52. Then, the operation goes to step S19 in which the control device 50 controls the rotational speed of the desiccant rotor 31 or the rotational speed of the fan 47 on the basis of the humidity of the air passing through the duct 25. Specifically, the rotational speed of the desiccant rotor 31 is increased or the rotational speed of the fan 47 is increased when the humidity of the air passing through the duct 25 is lower than a preset range. On the other hand, the rotational speed of the desiccant rotor 31 is reduced or the rotational speed of the fan 47 is reduced when the humidity of the air passing through the duct 25 is higher than the preset range. Then, the operation returns to step S11 and the above-described processing is repeated. This processing is repeatedly carried out until stopped by an operator.

As described above, in this embodiment, the outdoor air is introduced into the computer room 10 when the temperature of the outdoor air is low. In addition, when the humidity of the outdoor air is low, the air to be introduced into the computer room 10 is humidified with the water vapor generated by using the high-temperature air discharged from the computer room 10. This may make it possible to reduce loads on the air-conditioning machine 15 and the humidifier located in the computer room 10, and thereby to bring about an effect that power used for air conditioning the computer room 10 may be reduced.

Here, it is preferable to dry the inside of the water vapor retention chamber 20a when the air-conditioning system is stopped for a long period. In the case of the air-conditioning system of this embodiment, the water vapor retention chamber 20a may be dried by rotating the fan 46 while opening the air valves 42 and 43 as well as closing the air valve 41.

In the above-described embodiment, the outdoor air introduced through the duct 26 is mixed with the air in the computer room 10 introduced through the duct 24, and then the mixed air is supplied to the desiccant rotor device 30. Instead, the outdoor air may be supplied directly to the desiccant rotor device 30. However, in the latter case, the amount of humidification is likely to be reduced because the air supplied to the desiccant rotor device 30 has a low temperature. For this reason, it is preferable to mix the outdoor air with the air in the computer room 10 and thereby to increase the temperature of the mixed air as in the above-described embodiment.

Further, the mixing ratio between the air in the computer room 10 introduced through the duct 24 and the outdoor air may be changed depending on the temperature detected by the sensor unit 52.

A result of investigation of power consumption in the case of performing humidification by using the desiccant rotor device and the case of performing humidification by using a heating-type humidifier will be described below.

Example 1

The air-conditioning system depicted in FIG. 2 is constructed as Example 1. The desiccant rotor 31 has a diameter of 20 cm. Airtightness of each of a space between a housing of the water vapor retention chamber 20a and the desiccant rotor 31 and a space between a housing of the humidification chamber 20b and the desiccant rotor 31 is secured by using a seal material (a packing) made of a fluororesin.

The desiccant rotor 31 employing a corrugated fin structure is used. Activated carbon in an amount of about 600 g, which is subjected to a surface treatment with nitric acid and thereby provided with a hydrophilic property, is filled as the adsorbent in the desiccant rotor 31. The activated carbon has a grain size of about 500 μm.

Then, the air-conditioning system is operated when the outdoor air has the temperature of about 10° C. and the humidity of about 35%. At this time, the air introduced from the computer room 10 into the ducts 21 and 24 has the temperature of about 35° C. and the humidity of about 28%. Meanwhile, the air prepared by mixing the air in the computer room 10 with the outdoor air at a volume ratio of 1:1 is supplied to the humidification chamber 20b at a flow rate of 1 m$^3$/min.

The temperature of the air after passing through the desiccant rotor 31 is measured with the sensor unit 52 inside the duct 25, and the numbers of revolutions of the desiccant rotor device 30 and the fans 46 to 48 are controlled in such a manner as to set the temperature of the air flowing in the duct 25 equal to 20° C. and to set the humidity thereof equal to 55%. Here, the number of revolutions of the desiccant rotor 31 is set to 1 to 2 revolutions per minute.

In this case, the power consumption by the desiccant rotor device 30 is equal to 50 W while the power consumption by the fans 46 to 48 is equal to 120 W, and the total power consumption is equal to 170 W.

Example 2

An air-conditioning system is constructed in a similar manner to Example 1 except that silica gel (manufactured by Fuji Silysia Chemical Ltd.) in an amount of 800 g is filled as the adsorbent in the desiccant rotor 31. In addition, similarly to Example 1, the temperature of the air after passing through the desiccant rotor 31 is measured with the sensor unit 52 inside the duct 25, and the numbers of revolutions of the desiccant rotor device 30 and the fans 46 to 48 are controlled in such a manner as to set the temperature of the air flowing in the duct 25 equal to 20° C. and to set the humidity thereof equal to 55%. Here, the number of revolutions of the desiccant rotor 31 is set to 1 revolution per minute.

In this case, the power consumption by the desiccant rotor device 30 is equal to 60 W while the power consumption by the fans 46 to 48 is equal to 120 W, and the total power consumption is equal to 180 W.

Comparative Example

Figure 6:
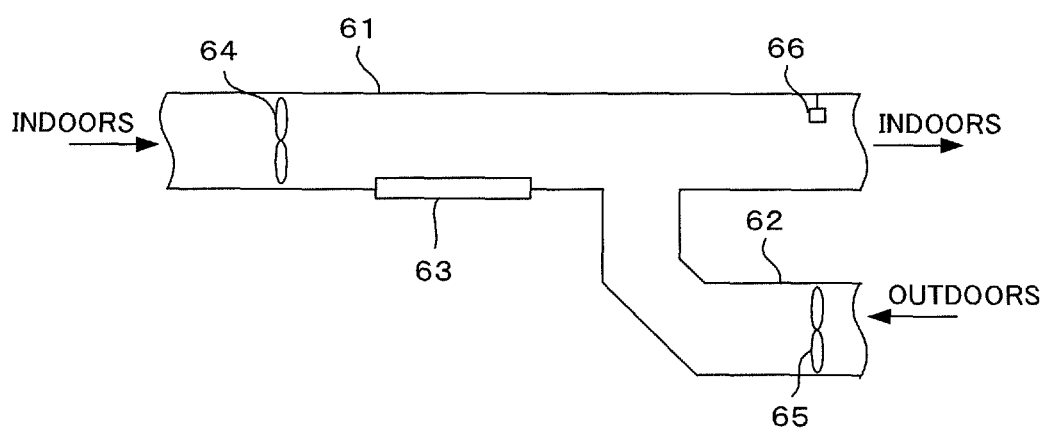
FIG. 6 is a schematic diagram of an air-conditioning system of a comparative example, which is provided with a heating-type humidifier.

A heating-type humidifier 63 is located inside a duct 61 as depicted in FIG. 6. Relatively high-temperature air is introduced from a computer room into the duct 61 by a fan 64, and humidified air is released in the computer room from the opposite side. Here, the heating-type humidifier 63 includes a non-woven fabric, a water supply pipe configured to supply water to the non-woven fabric, and an electric heater configured to heat the non-woven fabric.

A duct 62 is connected to a halfway portion (downstream of the heating-type humidifier 63) of the duct 61. Outdoor air is introduced from the outdoors into this duct 62 by a fan 65. In addition, a sensor unit 66 configured to detect the temperature and humidity of the air passing through the duct 61 is located at an outlet side of the duct 61.

Using the air-conditioning system depicted in FIG. 6, the numbers of revolutions of the fans 64 and 65 are controlled in such a manner as to set a volume ratio between the air introduced from the computer room into the duct 61 and the air (the outdoor air) introduced from the outdoors into the duct 62 equal to 1:1. As a result, the temperature of the air discharged from the duct 61 is set equal to 20° C. and the humidity thereof is set equal to 50%. In this case, the total power consumption by the heating-type humidifier 63 (the heater) and the fans 64 and 65 is equal to 350 W.

From Examples 1 and 2 as well as Comparative Example described above, the power reduction effect of the air-conditioning systems according to the embodiment is successfully confirmed.

It is to be noted that the technique disclosed in the above-described embodiment is not limited only to an air-conditioning system for air conditioning a computer room, but may be also applicable to air conditioning in a room where an electronic instrument other than a computer is installed.

All examples and conditional language recited herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that the various changes, substitutions, and alterations could be made hereto without departing from the spirit and scope of the invention.

What is claimed is:

1. An air-conditioning system comprising:
   a first duct through which air discharged from an electronic instrument passes;
   a water vapor retention chamber;
   an evaporator configured to be heated by the air passing through the first duct and thereby to generate water vapor inside the water vapor retention chamber;
   a desiccant rotor including an adsorbent to adsorb moisture and configured to be driven and rotated by a driving unit;
   a humidification chamber;
   a second duct configured to feed outdoor air introduced from an outdoor space into the humidification chamber; and
   a third duct configured to feed the air passing through the humidification chamber into a room where the electronic instrument is installed,
   wherein the evaporator includes:
      a heat-absorbing plate located in the first duct; and
      a water storage unit located in the water vapor retention chamber and thermally connected to the heat-absorbing plate, and
   wherein a portion of the desiccant rotor is located inside the water vapor retention chamber, and another portion of the desiccant rotor is located inside the humidification chamber.

2. The air-conditioning system according to claim 1, further comprising:
   a fourth duct to which air in the room where the electronic instrument is installed is introduced,
   wherein the air prepared by mixing the outdoor air introduced through the second duct with the air introduced through the fourth duct is supplied to the humidification chamber.

3. The air-conditioning system according to claim 2, further comprising:
   a first flow rate adjustment unit capable of adjusting a flow rate of the outdoor air to be introduced into the second duct; and
   a second flow rate adjustment unit capable of adjusting a flow rate of the air to be introduced into the fourth duct.

4. The air-conditioning system according to claim 2, further comprising:
   a fifth duct directly connecting the second duct to the third duct,
   wherein a switch valve configured to switch a direction of flow of the outdoor air introduced into the second duct to any one of a direction toward the humidification chamber and a direction toward the fifth duct is provided at a junction of the second duct and the fifth duct.

5. The air-conditioning system according to claim 1, further comprising:
   a sensor unit configured to detect a humidity of the air passing through the third duct; and
   a control device configured to control a rotational speed of the desiccant rotor in accordance with a humidity detection result obtained by the sensor unit.

6. The air-conditioning system according to claim 1, wherein activated carbon is contained in the desiccant rotor.

7. The air-conditioning system according to claim 1, wherein an openable and closable air valve is provided at each of two ends of the water vapor retention chamber.

8. The air-conditioning system according to claim 1, wherein the electronic instrument is a computer.

9. An air-conditioning system comprising:
   a first duct through which air discharged from an electronic instrument passes;
   a water vapor retention chamber;
   an evaporator configured to be heated by the air passing through the first duct and thereby to generate water vapor inside the water vapor retention chamber;
   a desiccant rotor including an adsorbent to adsorb moisture and configured to be driven and rotated by a driving unit;
   a humidification chamber;
   a second duct configured to feed outdoor air introduced from an outdoor space into the humidification chamber;
   a third duct configured to feed the air passing through the humidification chamber into a room where the electronic instrument is installed;
   a fourth duct connected to the second duct and configured to supply air in the room where the electronic instrument is installed to the humidification chamber;
   a fifth duct directly connecting the second duct to the third duct; a first flow rate adjustment unit capable of adjusting a flow rate of the air to be introduced into the second duct; a second flow rate adjustment unit capable of adjusting a flow rate of the air to be introduced into the fourth duct;
   a switch valve located at a junction of the second duct and the fifth duct and configured to switch a direction of flow of the outdoor air introduced into the second duct to any one of a direction toward the humidification chamber and a direction toward the fifth duct;
   a first sensor unit configured to detect a temperature and a humidity of the outdoor air;
   a second sensor unit configured to detect a temperature and a humidity of the air passing through the third duct; and
   a control device configured to control the first flow rate adjustment unit, the second flow rate adjustment unit, the switch valve, and the desiccant rotor in accordance with outputs from the first sensor unit and the second sensor unit,
   wherein a portion of the desiccant rotor is located inside the water vapor retention chamber, and another portion of the desiccant rotor is located inside the humidification chamber.

* * * * *